United States Patent
Troccoli (10) Patent No.: US 8,734,008 B2
(45) Date of Patent: May 27, 2014

(54) VOLTAGE READING TECHNIQUE FOR LARGE SENSOR ARRAYS THROUGH REDUCED NOISE DIFFERENTIAL PATH

(75) Inventor: Matias N. Troccoli, Kirkland, WA (US)

(73) Assignee: Next Biometrics AS, Nesoya (NO)

( * ) Notice: Subject to any disclaimer, the term of this patent is extended or adjusted under 35 U.S.C. 154(b) by 14 days.

(21) Appl. No.: 13/127,906

(22) PCT Filed: Nov. 3, 2009

(86) PCT No.: PCT/US2009/063055
§ 371 (c)(1),
(2), (4) Date: May 5, 2011

(87) PCT Pub. No.: WO2010/053894
PCT Pub. Date: May 14, 2010

(65) Prior Publication Data
US 2011/0211611 A1 Sep. 1, 2011

Related U.S. Application Data

(60) Provisional application No. 61/111,411, filed on Nov. 5, 2008.

(51) Int. Cl.
*G01N 25/00* (2006.01)

(52) U.S. Cl.
USPC ............ 374/45; 374/120; 374/121; 374/130; 374/131; 374/132; 250/553; 257/467; 257/470; 257/414; 257/225; 257/228; 257/290; 257/291; 257/292; 257/293; 257/431; 257/448; 257/458; 257/461; 348/294

(58) Field of Classification Search
USPC .......... 374/120, 121, 130, 131, 132; 250/208, 250/553, 338.1; 382/124; 257/225, 228, 257/290, 291, 292, 293, 431, 448, 458, 461, 257/E31.001, E31.052, E31.053, E31.055, 257/E31.113; 348/294
See application file for complete search history.

(56) References Cited

U.S. PATENT DOCUMENTS

| | | | | |
|---|---|---|---|---|
| 5,721,422 A | * | 2/1998 | Bird | 250/208.1 |
| 5,900,767 A | * | 5/1999 | Bird et al. | 327/407 |
| 5,907,627 A | * | 5/1999 | Borza | 382/124 |

(Continued)

FOREIGN PATENT DOCUMENTS

| | | |
|---|---|---|
| CN | 1295722 A | 2/1999 |
| CN | 1363178 A | 8/2002 |
| WO | WO99/39394 A1 | 8/1999 |
| WO | WO2006/033582 A1 | 3/2006 |

OTHER PUBLICATIONS

Diodes and Transistors, Sep. 2006. P517/617 LecS, P1.*

(Continued)

*Primary Examiner* — Lisa Caputo
*Assistant Examiner* — Janice M Soto
(74) *Attorney, Agent, or Firm* — Duane Morris LLP (57) ABSTRACT

An active sensor apparatus includes an array of sensor elements arranged in a plurality of columns and rows of sensor elements. The sensor apparatus includes a plurality of column and row thin film transistor switches for selectively activating the sensor elements, and a plurality of column and row thin film diodes for selectively accessing the sensor elements to obtain information from the sensor elements. The thin film transistor switches and thin film diodes are formed on a common substrate.

17 Claims, 9 Drawing Sheets

(56) References Cited

U.S. PATENT DOCUMENTS

| | | |
|---|---|---|
| 6,091,837 A | 7/2000 | Dinh |
| 6,108,438 A | 8/2000 | Bird et al. |
| 6,501,064 B2 | 12/2002 | Kole |
| 7,229,860 B2 | 6/2007 | Song et al. |
| 2006/0125971 A1* | 6/2006 | Abileah et al. .................. 349/42 |
| 2006/0217915 A1* | 9/2006 | Dinh ............................. 702/116 |

OTHER PUBLICATIONS

International Search Report dated Dec. 16, 2009 in corresponding PCT Application No. PCT/US2009/063055.

Office Action issued on May 6, 2013 in corresponding Chinese Application No. 200980153621.0.

* cited by examiner

VOLTAGE READING TECHNIQUE FOR LARGE SENSOR ARRAYS THROUGH REDUCED NOISE DIFFERENTIAL PATH

CROSS-REFERENCE TO RELATED APPLICATION

This application claims priority to U.S. Provisional Patent Application No. 61/111,411 filed Nov. 5, 2008, the entirety of which is hereby incorporated by reference herein.

FIELD OF THE INVENTION

The present invention relates to sensor arrays and more specifically to active sensor arrays and structures for addressing and reading data from these active sensor arrays.

BACKGROUND OF THE INVENTION

In the field of large area electronics, low cost but high performance sensors are one of the most targeted applications. These sensors can be used for a variety of acquisition functions such as thermal measurements, x-ray detection, and pressure sensing, to name a few. These devices are used in diverse fields including medical, environmental, security and industrial, amongst others. Development and commercialization of these sensing arrays are usually dictated by the cost of the processing technology used to build them as well as their sensing accuracy. Because these sensors are built over a large area, selecting a suitable technology that can yield the appropriate level of accuracy at an acceptable cost is often difficult.

The most efficient and accurate sensing arrays are based on active principles. Active sensors quantify a specific physical parameter response to a given stimulus. For example, active thermal sensors measure an object's heat conductance for a given heating stimulus. Examples of sensors of this type are disclosed in U.S. Pat. No. 6,091,837 to Dinh, entitled "Sensor for Acquiring a Fingerprint Image Based on Heat Transfer" (hereinafter "Dinh I") and WO 2006/033582 A1, also to Dinh, entitled "Apparatus for Fingerprint Sensing and Other Measurements" (hereinafter, "Dinh II"), the entirety of each of which is hereby incorporated by reference herein. The response to the stimulus is measured by each of the sensing sites within a sensor array. The response is in part a function of the stimulus provided, i.e., the larger the stimulus, the larger the response.

Recent advances in lower cost semiconductor electronics, such as high performance polycrystalline silicon ("polysilicon") thin film transistors (TFTs), have enabled the implementation of accurate sensing arrays at a reduced cost. Use of this technology also provides the ability to integrate control circuitry on the same panel as the sensing array, further reducing cost and increasing integration levels. One of the main drawbacks of using these lower cost technologies, however, is their limited device performance when compared to conventional, single crystalline electronics. Even though material properties have improved dramatically in recent years, improvements are still needed. For example, it is important to acquire an electric signal which is free of electrical noise (i.e., a signal that has good signal-to-noise ratio). This ratio eventually determines the accuracy of the system. Thin films transistor devices formed using polycrystalline material can generate high amounts of electrical noise particularly, when using a large stimulus to obtain a high response. This makes the task of obtaining a good signal to noise ratio difficult.

Therefore, sensing devices having improved device performance are desired.

SUMMARY OF THE INVENTION

An active sensor apparatus includes an array of sensor elements arranged in a plurality of columns and rows of sensor elements. The sensor apparatus includes a plurality of column and row thin film transistor switches for selectively activating the sensor elements, and a plurality of column and row thin film diodes for selectively accessing the sensor elements to obtain information from the sensor elements. The thin film transistor switches and thin film diodes are formed on a common substrate.

An apparatus for measuring a pattern in a surface of an object is also provided and includes an array of sensor elements including a plurality of columns and rows of sensor elements. The sensor elements are responsive to a physical parameter of the object on the array surface. The apparatus includes a current source, a plurality of column and row thin film transistor switches for selectively connecting the sensor elements to the current source for activation, and a plurality of column and row thin film diodes for selectively accessing the sensor elements to obtain a differential signal representative of the physical parameter from the sensor elements. The thin film transistor switches and thin film diodes are formed on a common substrate.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

A topology is disclosed herein for active sensor array addressing and signal acquisition that reduces induction of TFT switch noise. This approach is discussed herein for active sensing pixels that use a biasing current stimulus and produce a voltage response. Due to their reduced noise levels when compared to thin film transistor (TFT) switches, a properly connected diode at the end of each row line and column line is used to create a differential signal path. TFTs are still used as addressing switches (i.e., to route bias current to the array). The differential signal path elements and addressing switches are ideally formed on the same substrate. In one preferred embodiment, fingerprint sensors using this topology are contemplated that can exhibit higher signal-to-noise ratio and consequently better accuracy in identifying prints under a variety of adverse conditions.

Figure 1A:
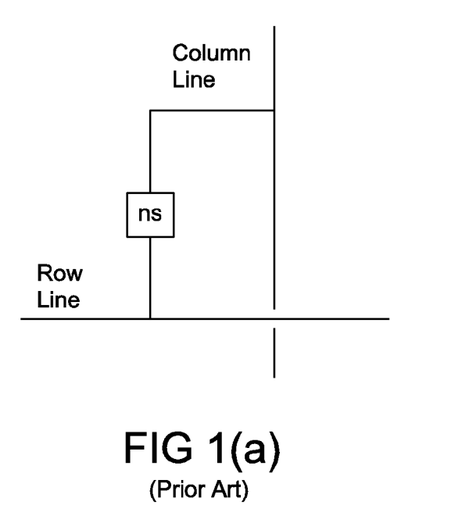
FIGS. 1(a) and 1(b) illustrate prior art active sensing pixels.
Figure 1B:
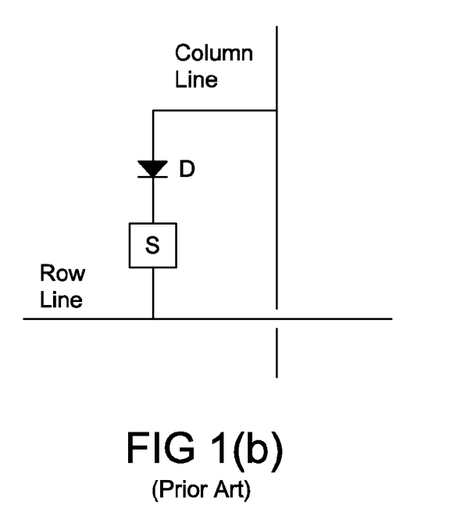
Figure 2:
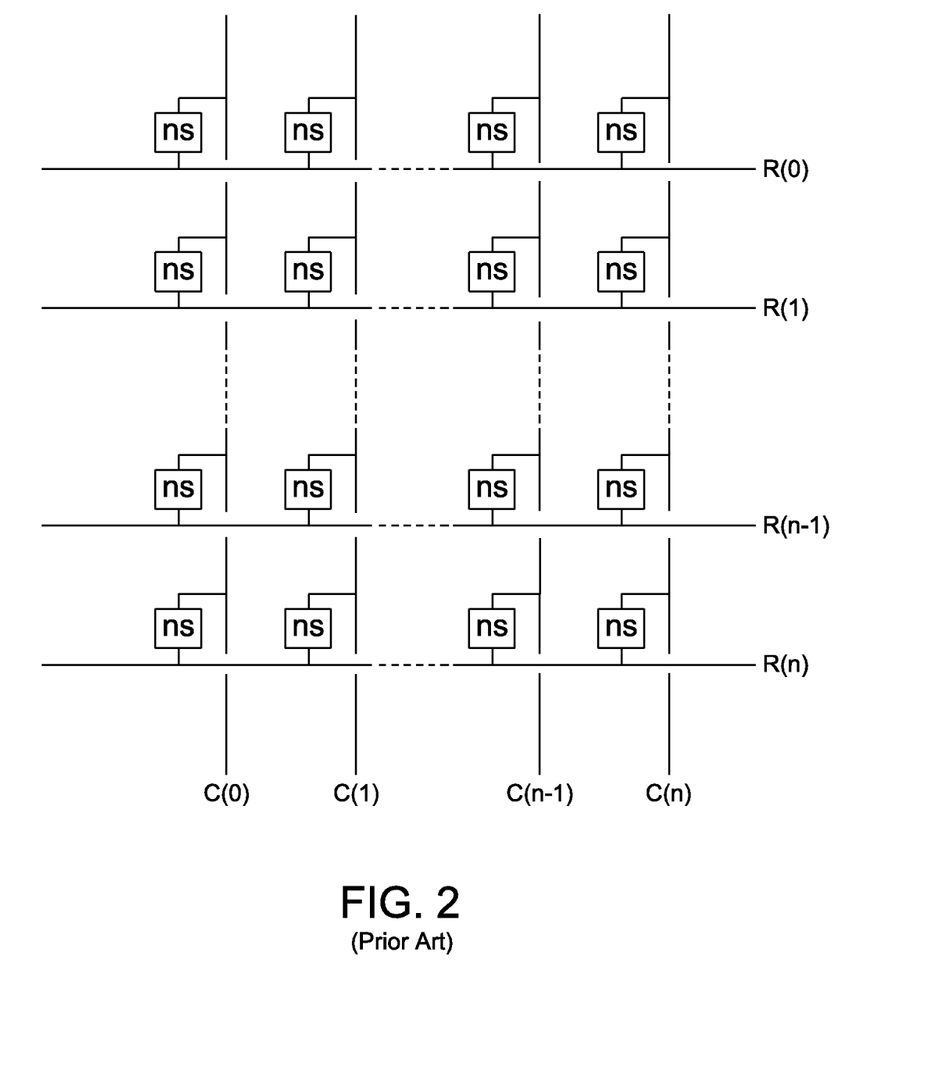
FIG. 2 illustrates a prior art sensing array.

In large area sensor arrays (e.g., 100 mm$^2$ or greater), thousands of sensing sites are arranged in rows and columns that are accessed and controlled by horizontal and vertical conducting traces. It is critical that each site can be accessed independently and that information read from a site be isolated from other sensing sites. Furthermore, due to space limitations all functions have to be performed by a minimal number of devices. In the prior art, switchable pixels, labeled "ns" in FIG. 1(*a*), are utilized for the sensing sites. By utilizing a non-linear device pixel, such as a diode D in combination with a sensing device S (as shown in FIG. 1(*b*)), electrical isolation is provided from other sensing sites when connected in an array fashion. Arrays of this type are disclosed in Dinh II. The diode D provides the isolation/selection function and the sensing device S is used as the active sensing element. Sensing sites with two terminals can share one connection horizontally (forming row lines) and one connection vertically (forming the column lines). This arrangement is shown in FIG. 2. The vertical conducting traces provide the biasing current, assuming the anode of diode D is connected to the column line. Biasing current flows to a sensing site when its corresponding column terminal is biased and its corresponding row terminal is grounded.

An array can be controlled by external circuitry that sequentially enables each column and each row. This is done by applying a biasing current to the vertical conducting traces (column selection) and by grounding the horizontal traces (row selection). External circuitry is then used to measure the voltage signal at the head of a selected column and at the end of a selected row. This differential signal represents the information for each sensing site that can be correlated to a physical parameter being sensed.

As mentioned in the Background section, advances in lower cost semiconductor electronics, such as high performance polycrystalline silicon thin film transistors, have enabled the implementation of accurate sensing arrays at a reduced cost. They also provide the ability to integrate control circuitry on the same panel as the sensing array, further reducing cost and increasing integration level. Addressing circuits such as shift registers, decoders and row and column switches are the preferred circuit implementations for addressing sensor arrays due to their low complexity. One of the main drawbacks, however, of using these lower cost technologies is their limited device performance when compared to conventional single crystalline electronics. The thin film polycrystalline material can yield devices that can generate high amounts of electrical noise. In particular, integrating external circuits with the array for addressing functions, such as the TFT switches used to pull array lines high or low, can introduce noise into the differential signal paths used for reading the sensors. One solution is to implement really large devices (e.g., at least 4 mm wide for polycrystalline TFTs) to create a different readout path (than the biasing path), but this solution can reduce yield and affects dynamic response. This approach is explained in connection with FIG. 3.

Figure 3:
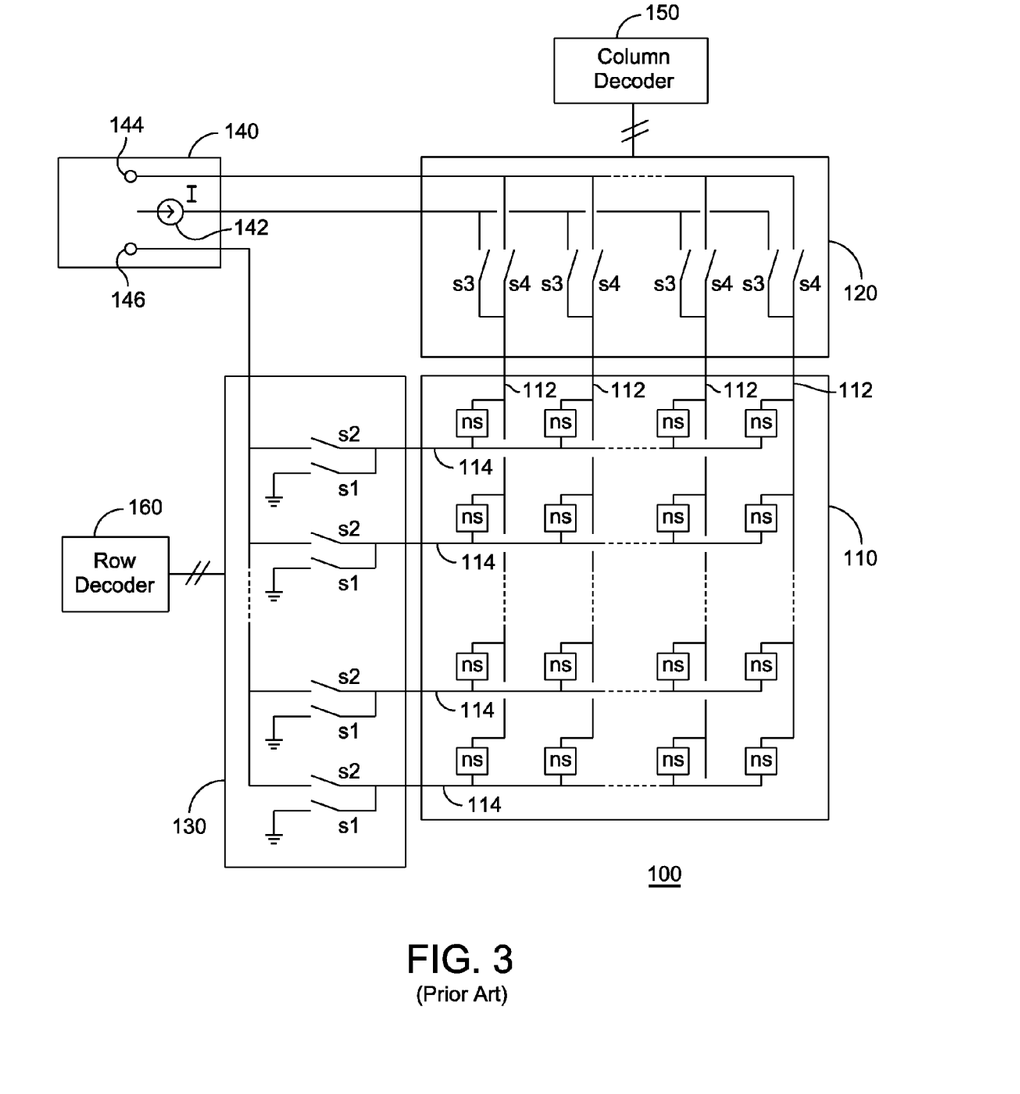
FIG. 3 illustrates a prior art sensing array having switching structure for selectively biasing and reading pixel sites.

FIG. 3 shows a prior art sensing apparatus 100 including a sensor array 110 formed of nonlinear sensing pixels "ns" as well as surrounding row and column switching circuits. Reference 112 identifies column lines and reference 114 identifies row lines. Each sensing site has a column terminal connected to a column line 112 and a row terminal connected to a row line 114. Block 140 provides the stimulus current from a current source 142 for each pixel site in the array 110. The biasing current is directed into the correct columns lines 112 by TFT switches 's3,' which can be multiplexed by a decoder or shift register circuit. When a column 112 is selected, the TFT switch s3 connects the respective column line 112 to the current source 142, thereby allowing the stimulus current to flow into the pixel site. When the column is deselected, the corresponding TFT switch is connected to ground (not shown) to ground the column line. In a similar fashion, row lines are activated by TFT switches 's1'. These switches are connected to ground when a row line is selected, allowing the current to flow out of the pixel site after it flows through the pixel 'ns'. When a row is deselected, the corresponding TFT switch 's1' connects the row line to a high potential (not shown), reverse biasing the pixels connected to the deselected row.

Column and row decoders 150, 160 are provided for controlling switches s3, s4 and s1, s2, respectively, of column switching module 120 and row switching module 130. These decoders may also take the form of shift registers.

In this prior art sensor 100, the data signal that is present at each pixel (i.e., the differential voltage signal) is detected from the array 100 by a differential reading circuit (not shown) coupled to two high impedance nodes 144, 146 in block 140, which are connected to column lines 112 and row lines 114, respectively, through two large transistors 's4' and 's2,' respectively. This technique is most adequate for standard single crystal technologies with acceptable device noise levels.

As described hereafter, a new topology for active array addressing and differential signal acquisition is provided that reduces switch noise. Thin film polysilicon diodes have shown lower noise levels than polysilicon TFT's (in particular the PIN diode structure described below in connection with FIG. 4(*b*). For this reason, the topology of the preferred embodiments includes properly connected diodes at the end of each row line and column line, which are used in order to form the path for differential signal acquisition. TFT's are still used as addressing switches.

Figure 5:
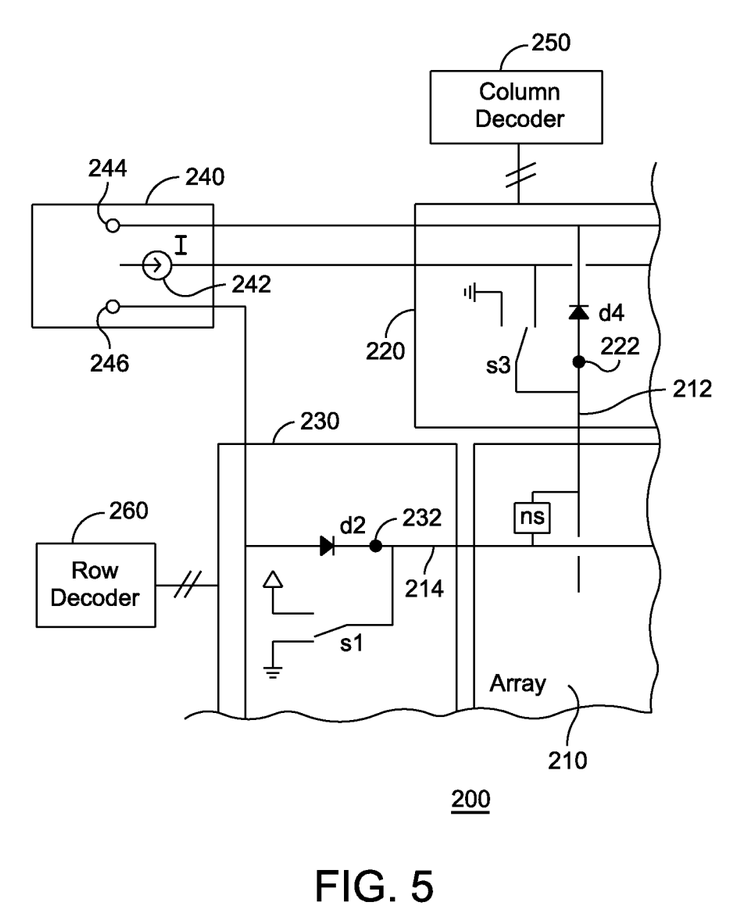
FIG. 5 is a partial diagram of a sensing array according to the present invention having an improved switching structure for selectively biasing and reading pixel sites.

FIG. 5 is a partial diagram of a sensing array according to the present invention having an improved switching structure for selectively biasing and reading pixel sites. As shown in FIG. 5, an array 210 of sensing elements is connected to column switching module 220 and row switching module 230. Although only one sensing element "NS" is shown, this is purely for purposes of illustration and it should be understood that the array 210 includes, as shown in FIG. 3, a plurality of rows 214 and a plurality of columns 212 coupled to a plurality of sensing elements NS to form an array. Column decoder 250 and row decoder 260 are connected to the switching modules 220 and 230, respectively, to control TFT switches S3 and S1. A current source 242 is coupled to the columns 212 through switches S3. Switches S1 selectively couple rows 214 to ground (when selected) and a high voltage (when deselected).

In the device of FIG. 5, the switches 's2' and 's4' shown in FIG. 3 are replaced by the diodes 'd2' and 'd4', which also preferably are fabricated as polysilicon thin film devices on the same substrate as the polysilicon TFT switches s1, s3. Nodes 244 and 246 in module 240 are no longer required to be high impedance terminals but rather are used to provide small biasing currents for the switch diodes 'd2' and 'd4'. These currents assure that the diodes d2, d4 are in the correct operating mode. The polarity of the diodes is crucial. The diodes have to be connected properly such that they are forward biased (and thus turn "on") when a respective row 214 and column 212 are selected and reversed bias (and the turned "off") when a respective row 214 and column 212 are deselected. Diode d4 is arranged with its anode coupled to node 222 and its cathode coupled to terminal 244 so that diode d4 is forward biased when node 222 goes high, i.e., when switch s3 couples column 212 to current source 242, and so that diode d4 is reverse biased when node 222 goes low, i.e. when switch s3 couples column 212 to ground. Similarly, diode d2 is coupled with its anode coupled to terminal 246 and its cathode coupled to node 232 so that diode d2 is forward biased when node 232 goes low, i.e., when switch s1 couples row 214 to ground, and so that diode d2 is reverse biased (and thus "off") when node 232 goes high, i.e. when switch s1 couples row 214 to VSS.

An exemplary module 240 provides the biasing pixel current through current source 242, as well as the diode biasing current for diodes d2 and d4. These currents can be provided by external low noise sources and directed to the columns sequentially by TFTs in each column. This external module 240 also incorporates the circuits for differential voltage reading. Circuits for differential voltage reading or sensing are known in the art. By way of example only, standard instrumentation amplifiers can be adapted for this function. This circuitry can provide an analog or digital output that represents the pixel signal to a computer or other analysis tool.

With the design of FIG. 5, the data voltage generated by the sensing elements is in series with the voltage drops across the diodes d2, d4. These voltage drops are constant and can be regarded as an offset in the acquired signal. Therefore, they do not affect the sensing operation.

In one exemplary embodiment of the present invention, the switching architecture is incorporated into an active thermal sensor for fingerprint scanning as disclosed in, for example, Dinh I and/or Dinh II. The fine patterns formed by ridges and valleys on a finger's skin can be mapped by sensing arrays of high resolution. Some sensing arrays, such as those described in Dinh I and Dinh II utilize heat signals, while others utilize electrical or optical signals. Accuracy levels are limited by the physical principles used to read fingerprint patterns (i.e. optical, capacitive, pressure, etc.) and most have not yielded the level of accuracy required for biometric security purposes. Furthermore, immunity to environmental variables such as dirt or humidity is also important when performing a fingerprint scan.

Active thermal sensors measure an object's heat conductance for a given heating stimulus. This response is measured by each of the sensing sites within the sensor array. The thermal response of an element is in part a function to the heating stimulus one provides; the larger the heating stimulus, the larger the response.

Figure 6A:
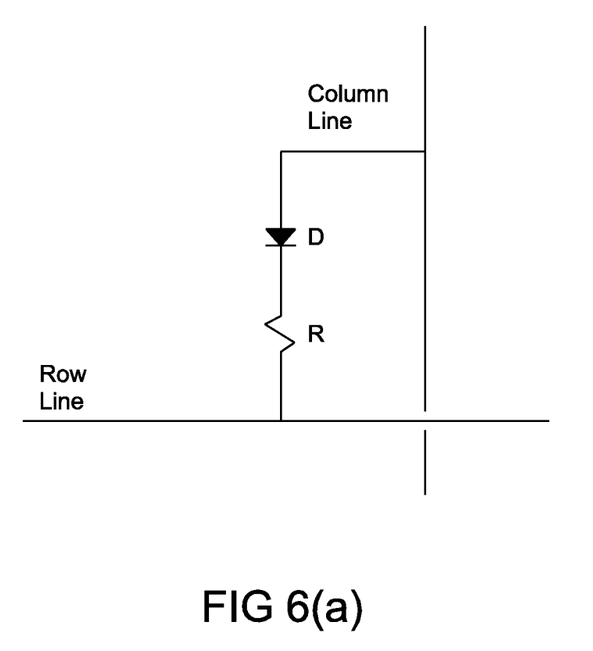
FIG. 6(a) is a diagram of an exemplary thermal sensing element for use with, for example, a thermal fingerprint sensor.
Figure 6B:
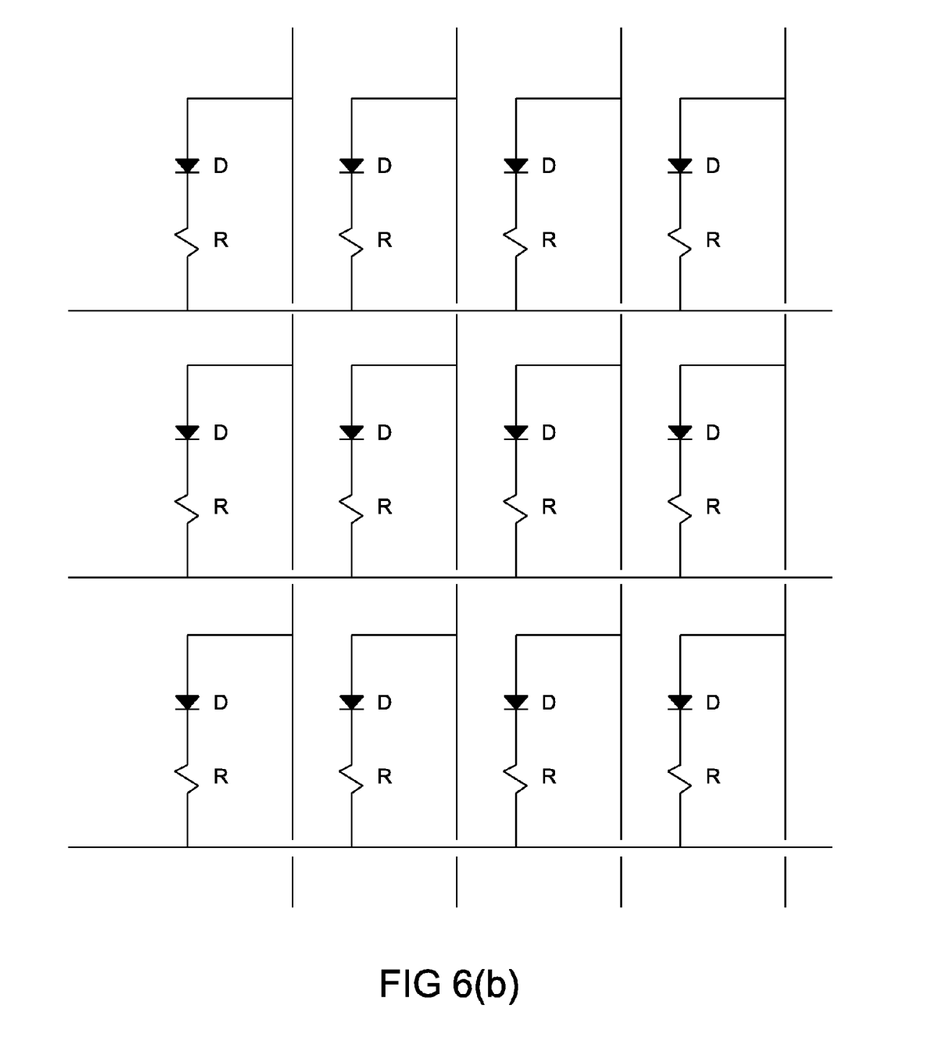
FIG. 6(b) is a diagram of an array of these thermal sensing elements.

In the system described herein, the heating effect is generated by forcing a large electrical current (up to several milliamps) through each sensing site (pixel). This heating current is provided by current source 242. In an exemplary embodiment of a sensing site shown in FIG. 6(a), each sensing site is composed of a diode D in series with a resistor R (as shown in Dinh II). Alternatively, this site could comprise a series of diodes. FIG. 6(b) shows an array of these sensing sites. The diode D functions as a selecting device that allows current to flow when addressed and provides isolation from other sensing sites when reversed biased. This diode D should not be confused with diodes d2, d4, which are used to form the differential signal path for reading information from each site. The resistor R acts as both an active sensing element and as a heating element. The voltage across this resistor is a function of the temperature the device reaches when heated. If a foreign object (e.g., fingerprint ridge) is placed near this device, some of the heating power will flow away from it and its temperature will not reach its maximum level at a given time. This is reflected electrically by a difference in voltage across the device (i.e. measured signal), which is read through the connections formed by diodes d2 and d4 of FIG. 5.

By using thin film polysilicon diodes, which have shown lower noise levels than polysilicon TFTs, as switching elements in the differential signal path for differential signal acquisition, switch noise is reduced and device accuracy is improved. In embodiments, fingerprint sensors using this topology would exhibit higher signal to noise ratio and consequently would be capable of accurately identifying prints under a variety of adverse conditions. Significant space savings are also achieved. In the prior art circuit of FIG. 3, the TFT switches s2 and s4 must be formed to lengths of about 4-5 mm in order to significantly reduce noise. However, TFTs of this size are impractical due to fabrication yield concerns. With the approach of FIG. 5, significant noise reductions can be achieved with diode devices having lengths of about, for example, 100 μm. In an array of several hundred rows and columns, this amounts to large area savings. For example, for a square array of 10 mm sides, the prior art TFT switches of 5 mm would add an extra 50% to both width and length.).

Figure 4A:
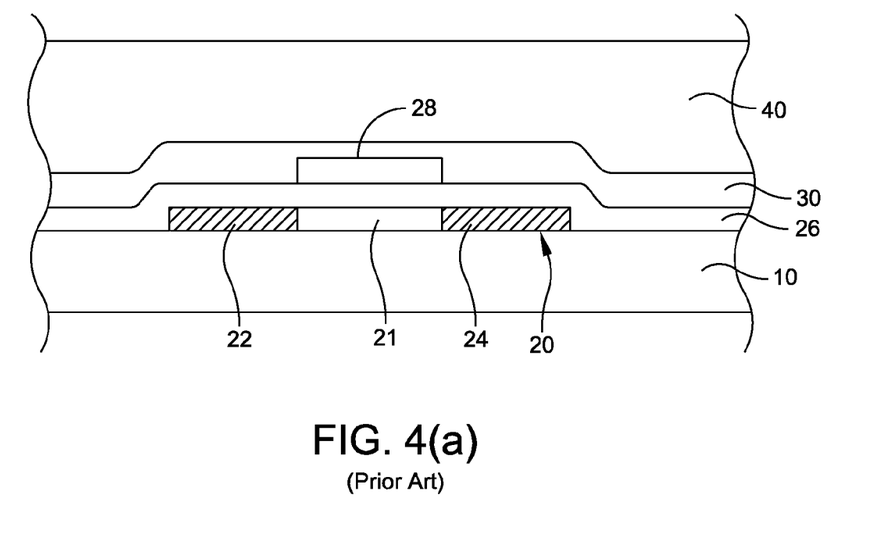
FIG. 4(a) is a sectional view of a polysilicon thin film transistor.
Figure 4B:
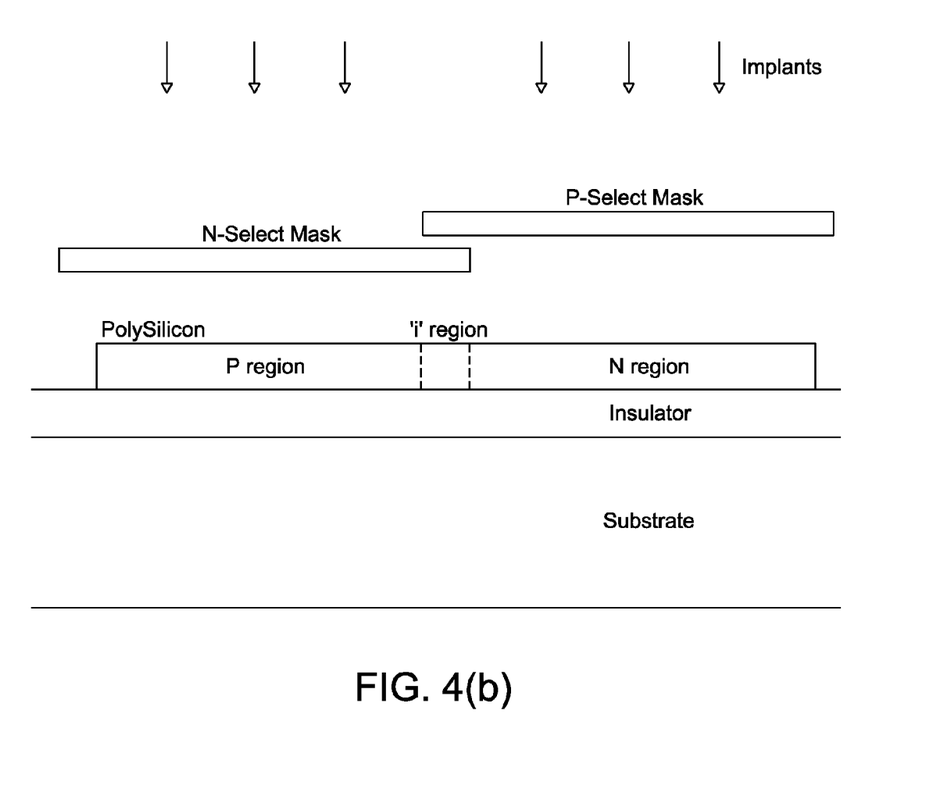
FIG. 4(b) is a sectional view illustrating the formation of a polysilicon thin film PIN diode.

By way of example only, FIG. 4(a) is a sectional view of a polysilicon TFT, such as disclosed in U.S. Pat. No. 7,229,860, which can be used as the polysilicon TFT switches s1, s3 shown in FIG. 5. As shown in FIG. 4(a), a semiconductor layer 20 of polysilicon is formed on a substrate 10 formed from, for example, glass, quartz or polymer. The semiconductor layer 20 includes a channel region 21, a source region 22 and a drain region 24 opposite the source region 22 with respect to the channel region 21. The source and drain regions 22 and 24 are doped with n-type or p-type impurities and may include a silicide layer. A buffer insulating layer may be provided between the substrate 10 and the semiconductor layer 20 in this TFT.

A gate insulating film 26 of $SiO_2$ or $SiN_x$ is formed on the substrate 10 to cover the polysilicon semiconductor layer 20. A gate electrode 28 is formed over the gate insulating film 26 opposite the channel region 21. A gate line (not shown) is connected to the gate electrode 28 and may be provided over the gate insulating film 26.

An interlayer insulating film 30 is formed on the gate insulating film 26 to cover the gate electrode 28. The gate insulating film 26 and interlayer insulating film 30 have contact holes (not shown) exposing the source and drain regions 22 and 24 of the semiconductor layer 20 to accommodate source and drain electrodes (not shown). Data lines (not shown) connected to the source and drain electrodes may be further formed on the interlayer insulating film 30. A passivation film 40 made of $SiN_x$, $SiO_2$, SiOC, SiOF, or organic insulating material may be formed on the interlayer insulating film 30 to provide physical protection, electrical protection and/or thermal conduction.

By way of example, FIG. 4(b) illustrates the formation of a thin film polysilicon PIN diode structure which may be used for the diodes d2 and d4 in the differential reading path of FIG. 5. PIN diode structures may also be used for diodes D (FIGS. 6(a)/6(b)) in the non-linear sensing elements. This diode structure is formed over a substrate on a continuous polysilicon layer divided into three regions: a "p" doped region (labeled "P region"), an intrinsic (undoped) region (labeled "'i' region"), and an "n" doped region (labeled "N region"). PIN diodes are suitable for this application because they provide good current drive and very low leakage current (i.e., no loss of signal). Furthermore, as FIG. 6(b) shows, they can be easily fabricated with CMOS polysilicon processing techniques. Implantation masks are shown in order to illustrate how a polysilicon material can be implanted to form the "p", "i" and "n" regions. For instance, and "n-select" implantation mask is used first to protect those areas that do not need "n" dopants. With this mask in place, "n" dopants are implanted into the polysilicon layer. In a second step, a "p-select" mask is used to protect those areas that do not need "p" dopants. With this mask in place, p-dopants are implanted into the polysilicon layer. By overlapping these two masks, an undoped intrinsic region is defined.

Figure 7:
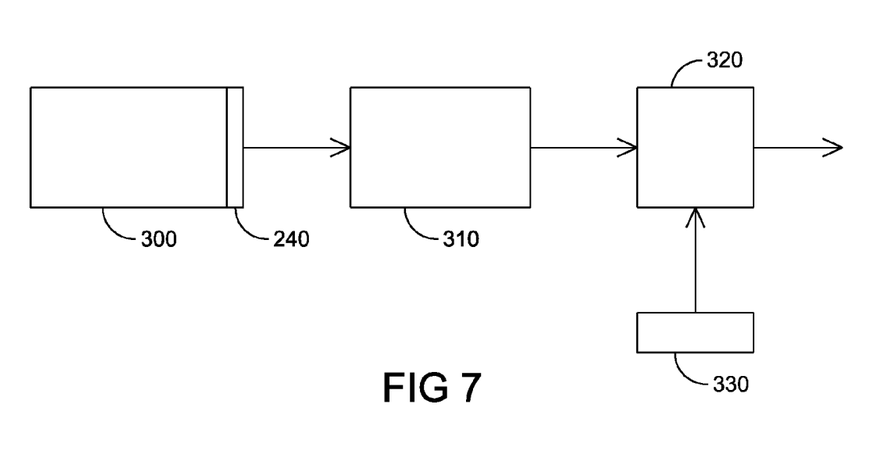
FIG. 7. shows in schematic block form a fingerprint recognition system incorporating the sensing device described herein.

FIG. 7 shows in schematic block form a fingerprint recognition system incorporating the sensing device, here represented by the block 300. The system includes means responsive to an output from the sensing circuit of the device to provide representative data of a sensed fingerprint, and means for comparing said representative data with stored representative data for one or more fingerprints. The output obtained from the sensing device is provided in a form comparable to the video output provided by an image sensor in known optical fingerprint sensing devices. Accordingly, and as will be apparent to skilled persons, components of the system, other than the sensing device, can be generally of the kind employed in systems using optical sensing devices. The representative data, in accordance with standard practice, may take the form of information regarding the orientation of ridge lines and relative positions of minutiae, that is the ending and bifurcations of the lines. The processing of information obtained from the sensing device to produce and compare representative data can follow known schemes and techniques. Because the sensing device of the invention is capable of providing information of the three dimensional profile of a fingerprint improved accuracy of identification or verification can be obtained by making use of topological features in addition to the spatial positions of minutiae, although of course use may be made only of information in respect of the two-dimensional ridge patterns to simplify the processing necessary if less accuracy is acceptable. Briefly, the output from the device 300, suitably conditioned, is fed to an analysis circuit 310 which is programmed to detect characterizing features of the fingerprint sensed such as the position of minutiae. Data from the circuit 310 is supplied to a computer 320 which through standard algorithms compares the data with representative data of a plurality of fingerprints, or a single fingerprint depending on whether the system is used for identification or merely verification purposes, held in a storage device 330 and which provides an output in accordance with whether or not a match has been found.

The circuit 310 can be programmed either to utilize the three dimensional information provided by the sensing device for high accuracy of recognition, or alternatively, with appropriate discrimination to select particular output signal values from the device 300, utilizing specific information representative of the two dimensional ridge pattern in the nature of a binary image similar to that obtained from known optical sensing devices.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An active sensor apparatus, comprising:
    an array of sensor elements, the array including a plurality of columns and rows of the sensor elements;
    a plurality of column and row thin film transistor switches for selectively activating the sensor elements; and
    a plurality of column and row thin film diodes for selectively accessing the sensor elements to obtain information from the sensor elements, wherein the thin film transistor switches and thin film diodes are formed on a common substrate,
    wherein the active sensor apparatus comprises a pair of differential signal nodes coupled to the column and row thin film diodes, wherein the active sensor apparatus further comprises a pair of differential signal node current sources coupled to the differential signal nodes for providing biasing current for maintaining forward biasing of the diodes during reading of the sensor elements.

2. The active sensor apparatus of claim 1, wherein the thin film transistor switches and thin film diodes are polysilicon thin film devices.

3. The active sensor apparatus of claim 1, wherein the sensor elements each includes a non-linear element.

4. The active sensor apparatus of claim 3, wherein each of the sensor elements includes a diode in series with a resistor.

5. The active sensor apparatus of claim 1,
    wherein each of the column thin film diodes is coupled to a respective column line such that it is forward biased when a corresponding column thin film transistor switch is triggered to select the respective column line, and
    wherein each of the row thin film diodes is coupled to a respective row line such that it is forward biased when a corresponding row thin film transistor switch is triggered to select the respective row line.

6. The active sensor apparatus of claim 1, further comprising a current source for providing current to the sensor elements upon selection by the column and row thin film transistor switches.

7. An apparatus for measuring a pattern in a surface of an object comprising:
    an array of sensor elements, the array including a plurality of columns and rows of the sensor elements, the sensor elements being responsive to a physical parameter of the object surface;
    a current source;
    a plurality of column and row thin film transistor switches for selectively connecting the sensor elements to the current source for activation; and
    a plurality of column and row thin film diodes for selectively accessing the sensor elements to obtain a differential signal representative of the physical parameter from the sensor elements, wherein the thin film transistor switches and thin film diodes are formed on a common substrate,
    wherein the apparatus comprises a pair of differential signal nodes coupled to the column and row thin film diodes, and further comprises a pair of differential signal node current sources coupled to the differential signal nodes for providing biasing current for maintaining forward biasing of the diodes during reading of the sensor elements.

8. The apparatus of claim 7, wherein the thin film transistor switches and thin film diodes are polysilicon thin film devices.

9. The apparatus of claim 7, wherein the sensor elements each includes a non-linear element.

10. The apparatus of claim 9, wherein each of the sensor elements includes a diode in series with a resistor.

11. The apparatus of claim 7,
    wherein each of the column thin film diodes is coupled to a respective column line such that it is forward biased when a corresponding column thin film transistor switch is triggered to select the respective column line, and wherein each of the row thin film diodes is coupled to a respective row line such that it is forward biased when a corresponding row thin film transistor switch is triggered to select the respect row line.

12. The apparatus of claim 7, wherein heat activation of the sensor elements is provided for by the current source, and temperature sensing is performed on the basis of a voltage change caused by the heat activation.

13. An active sensor apparatus, comprising:
an array of sensor elements, the array including a plurality of sensor elements coupled to a plurality of column lines and a plurality of row lines;
a current source for providing current to the sensor elements upon selection of a sensing element for activation;
a plurality of polysilicon thin film transistor switches coupled to the column and row lines for selectively activating the sensor elements; and
a plurality polysilicon thin film diodes coupled to ends of the column and row lines for selectively accessing the sensor elements for reading information from the sensor elements,
wherein each of the thin film diodes coupled to a column line is arranged such that it is forward biased when a corresponding thin film transistor switch coupled to the column line is triggered to select the column line,
wherein each of the thin film diodes coupled to a row line is arranged such that it is forward biased when a corresponding thin film transistor switch coupled to the row line is triggered to select the row line, and
wherein the thin film transistor switches and thin film diodes are formed on a common substrate,
wherein the active sensor apparatus comprises a pair of differential signal nodes coupled to the column and row thin film diodes, wherein the active sensor apparatus further comprises a pair of differential signal node current sources coupled to the differential signal nodes for providing biasing current for maintaining forward biasing of the diodes during reading of the sensor elements.

14. The active sensor apparatus of claim 13, wherein the sensor elements each includes a non-linear element.

15. The active sensor apparatus of claim 14, wherein each of the sensor elements includes a diode in series with a resistor.

16. An active thermal sensor apparatus, comprising:
an array of non-linear thermal sensor elements arranged in a plurality of columns and rows of sensor elements coupled to a corresponding plurality of column and row lines, the sensor elements being responsive to a physical parameter of an object surface;
a first current source for providing a current for activating the sensor elements;
a plurality of column and row thin film transistor switches for selectively activating the sensor elements, wherein an activation path for each sensor element comprises in series and in order the first current source, a thin film transistor switch coupled to a respective column line, the sensor element, and a thin film transistor switch coupled to a respective row line;
a pair of differential signal sensing nodes;
a plurality of column and row thin film diodes for selectively accessing the sensor elements to obtain a differential signal representative of the physical parameter from the sensor elements, wherein an access path for each sensor element comprises in series and in order a first one of the differential signaling nodes, a thin film diode coupled to a respective column line, the sensor element, a thin film diode coupled to a respective row line, and a second one of the differential signaling nodes, wherein each of the column thin film diodes is forward biased when a corresponding column thin film transistor switch is triggered to select the respective column line, and wherein each of the row thin film diodes is forward biased when a corresponding row thin film transistor switch is triggered to select the respective row line; and
a pair of current sources coupled to the differential signal nodes for providing biasing current for maintaining forward biasing of the diodes during reading of the sensor elements,
wherein the thin film transistor switches and thin film diodes are formed on a common substrate.

17. The active thermal sensor apparatus of claim 16 wherein the activation current from the first current source is greater than the biasing current from the pair of current sources for maintaining forward biasing of the diodes during reading of the sensor elements.

* * * * *